US012747155B2

(12) United States Patent
Lee

(10) Patent No.: US 12,747,155 B2
(45) Date of Patent: Sep. 29, 2026

(54) WAFER LEVEL PACKAGE FOR DEVICE

(71) Applicant: Teknologian tutkimuskeskus VTT Oy, Espoo (FI)

(72) Inventor: Jae-Wung Lee, Espoo (FI)

(73) Assignee: Teknologian tutkimuskeskus VTT Oy, Espoo (FI)

( * ) Notice: Subject to any disclaimer, the term of this patent is extended or adjusted under 35 U.S.C. 154(b) by 640 days.

(21) Appl. No.: 18/027,378

(22) PCT Filed: Sep. 20, 2021

(86) PCT No.: PCT/FI2021/050619
§ 371 (c)(1),
(2) Date: Mar. 21, 2023

(87) PCT Pub. No.: WO2022/058659
PCT Pub. Date: Mar. 24, 2022

(65) Prior Publication Data

US 2023/0382721 A1 Nov. 30, 2023

(30) Foreign Application Priority Data

Sep. 21, 2020 (FI) ..................................... 20205914

(51) Int. Cl.
*B81B 7/00* (2006.01)

(52) U.S. Cl.
CPC ........ *B81B 7/007* (2013.01); *B81B 2207/097* (2013.01)

(58) Field of Classification Search
CPC . B81B 7/007; B81B 7/0032; B81B 2207/097; B81B 2207/093; B81B 3/0064; B81C 1/00269; B81C 1/00301; B81C 2203/0118; B81C 2203/035; G01C 19/56; H03H 9/10
See application file for complete search history.

(56) References Cited

U.S. PATENT DOCUMENTS

2009/0014871 A1 1/2009 Meyer et al.
2010/0072563 A1* 3/2010 Sato ........................ B81B 7/007 257/E29.324
(Continued)

FOREIGN PATENT DOCUMENTS

EP 2346083 A1 7/2011
EP 2346083 B1 * 3/2016 .......... G01P 15/0802
(Continued)

*Primary Examiner* — Moazzam Hossain
(74) *Attorney, Agent, or Firm* — Laine IP Oy

(57) ABSTRACT

According to an example aspect of the present invention, there is provided a wafer level package (100) for a device, the package (100) comprising a first substrate (102) and a second substrate (103), at least one insulating stand-off structure (104) between the first substrate (102) and the second substrate (103), a bonding layer (108) on the at least one stand-off structure (104), and a first lateral electrical connection line (109) on a surface of the first substrate (102) and a second lateral electrical connection line (110) on a surface the second substrate (103), wherein electrical connection is formed between the first lateral electrical connection line (109) and the second lateral connection line (110) via the bonding layer (108) of the at least one stand-off structure (104).

20 Claims, 5 Drawing Sheets

(56) References Cited

U.S. PATENT DOCUMENTS

| | | | | |
|---|---|---|---|---|
| 2010/0084752 | A1* | 4/2010 | Horning | B81B 7/0038 257/E23.18 |
| 2012/0299128 | A1* | 11/2012 | Noda | B23K 20/023 257/415 |
| 2015/0115376 | A1 | 4/2015 | Chen et al. | |
| 2015/0145610 | A1 | 5/2015 | Ruby et al. | |
| 2020/0109045 | A1 | 4/2020 | Daneman et al. | |

FOREIGN PATENT DOCUMENTS

| | | | |
|---|---|---|---|
| FI | 20205075 | A1 | 7/2021 |
| JP | 2012043901 | A | 3/2012 |
| JP | 5315350 | B2 | 10/2013 |
| JP | 2018004448 | A | 1/2018 |

* cited by examiner

Fig. 4A
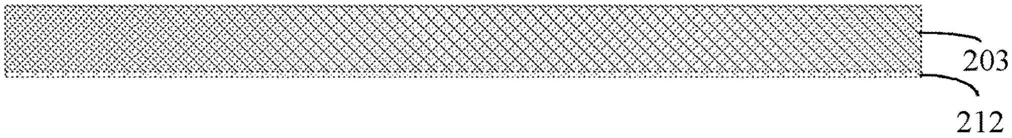
Fig. 4B
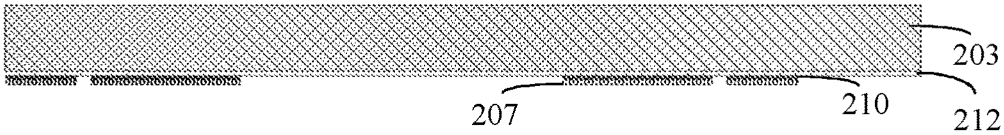
Fig. 4C
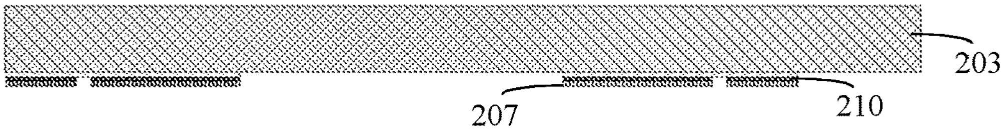
Fig. 4D
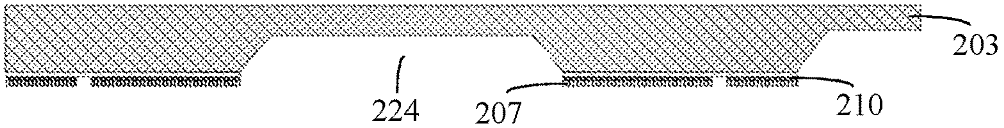
Fig. 4E
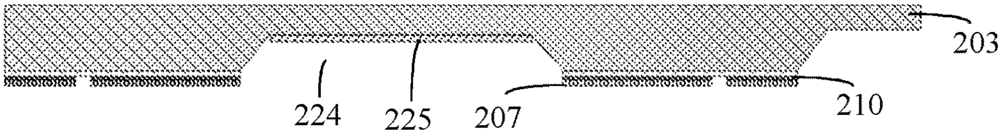
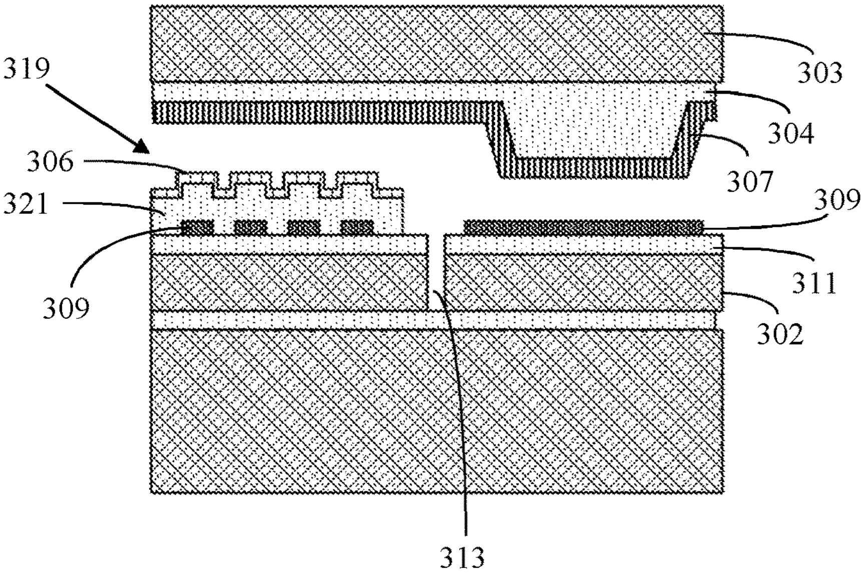
Fig. 5

WAFER LEVEL PACKAGE FOR DEVICE

FIELD

The present invention relates to a wafer level package for a device, in particular to a wafer level package for micro-electromechanical systems (MEMS).

BACKGROUND

Microelectromechanical systems (MEMS) are miniaturized mechanical and electro-mechanical elements, such as devices and structures that are made using the techniques of microfabrication. MEMS are comprised of components between 1 and 100 micrometers in size and MEMS devices generally range in size from 20 micrometers to a millimeter.

MEMS devices are susceptible to electrical failures due to their small size, composition and extremely demanding manufacturing methods. Forming an electrical interconnection by, for example, TSV (through-silicon via) is a complex and expensive process.

Thus, there is need for improved structures and manufacturing methods of a wafer packaging.

SUMMARY OF THE INVENTION

The invention is defined by the features of the independent claims. Some specific embodiments are defined in the dependent claims.

According to a first aspect of the present invention, there is provided a wafer level package for a device, the package comprising: a first substrate and a second substrate, at least one insulating stand-off structure between the first substrate and the second substrate, a bonding layer on the at least one stand-off structure, and a first lateral electrical connection line on a surface of the first substrate and a second lateral electrical connection line on a surface the second substrate. Electrical connection is formed between the first lateral electrical connection line and the second lateral connection line via the bonding layer of the at least one stand-off structure. The bonding layer comprises a eutectic alloy.

According to a second aspect of the present invention, there is provided a method for forming a wafer level package for a device comprising: making a first lateral electrical connection line on a surface of a first substrate, making a second lateral electrical connection line on a surface of a second substrate, making at least one insulating stand-off structure over a portion of the first lateral electrical connection line, making a first bonding material layer on the surface of the at least one stand-off structure, and bonding the first bonding material layer with the second lateral electrical connection line to create a bonding layer on the stand-off structure to create an electrical connection between the first lateral electrical connection line and the second lateral connection line via the bonding layer of the at least one stand-off structure. Bonding the first bonding material layer with the second lateral electrical connection line is provided by eutectic bonding.

According to an embodiment, the package comprises at least one trench in the first substrate.

According to an embodiment, electrical connection is formed over the at least one trench via the second lateral connection line According to an embodiment, electrical connection is formed over the at least one trench via the second bonding material layer.

According to an embodiment, the package comprises at least one sealing structure, which sealing structure comprises: a seal ring between the first substrate and the second substrate, a bonding layer on a surface of the second substrate, and plurality of micro-rings within the seal ring to confine metal melt of the bonding layer between micro-rings.

The present invention provides considerable advantages. The present invention enables a simple and cost effective way to provide an electrical interconnection between electrodes of devices and pads, especially when the electrodes and pads are separated by a deep trench and/or a deep trench with a cavity, or when electrodes of devices have a deep trench inside packaging and pads outside packaging. The structure is created automatically during fabricating a bonding structure. Thus, there is no need for additional lithography or etching processes, which would make the manufacturing process more complex and expensive.

The embodiments of the invention increase process window in the bonding of the substrates, especially in eutectic bonding of the substrates. The micro-rings also provide a precise gap due to a precise height of the micro-rings, which gap is free from temperature and pressure non-uniformities, such as voids.

The embodiments of the invention reduce slip misalignment between the bonding substrates due to local indentation and increased friction, hence improving bonding quality.

BRIEF DESCRIPTION OF THE DRAWINGS

FIGS. 4A to 4E illustrate a manufacturing method of a second structure of a wafer level package for a device in accordance with at least some embodiments of the present invention; and FIGS. 5 and 6 illustrate a wafer level package for a device in accordance with at least some embodiments of the present invention.

EMBODIMENTS

In the present context, the term "substrate" comprises a wafer, such as a MEMS device wafer and a cap wafer.

In the present context, the term "first structure" comprises a first substrate, such as a device wafer, and layers on the first substrate before bonding.

In the present context, the term "second structure" comprises a second substrate, such as s cap wafer, and layer(s) on the second substrate before bonding.

The object of at least some embodiments of the present invention is to provide a simple and cost effective electrical interconnection between electrodes of devices and pads, especially for a microelectromechanical systems (MEMS) device.

Figure 1:
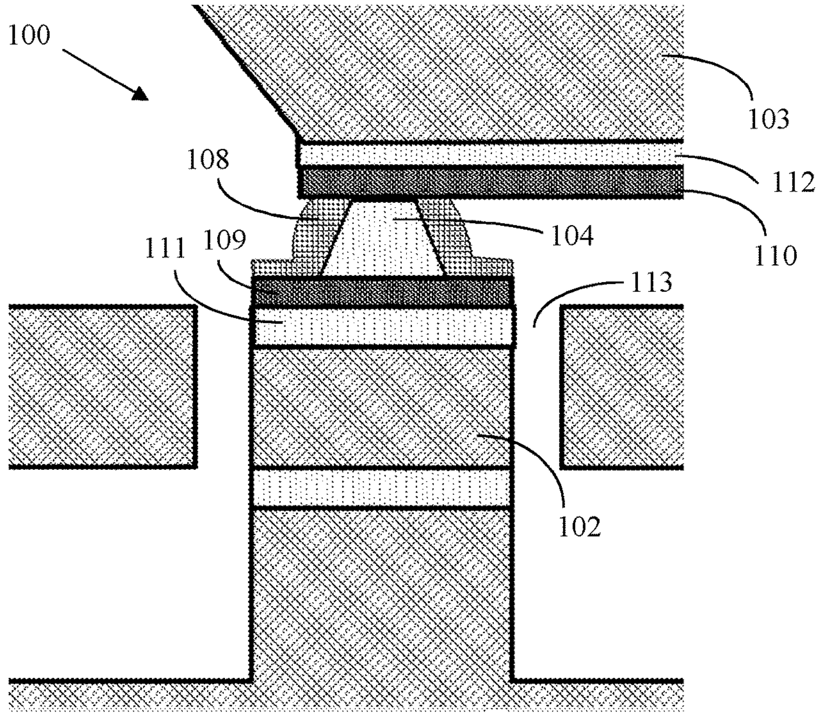
FIGS. 1 and 2A to 2C illustrate a wafer level package for a device in accordance with at least some embodiments of the present invention.

FIG. 1 illustrates a portion of a wafer level package 100 according to an embodiment. The package 100 comprises a first substrate 102 and a second substrate 103, at least one insulating stand-off structure 104 between the first substrate 102 and the second substrate 103, a bonding layer 108 on the at least one stand-off structure 104, and a first lateral electrical connection line 109 on a surface of the first substrate 102 and a second lateral electrical connection line 110 on a surface the second substrate 103. Electrical connection is formed between the first lateral electrical connection line 109 and the second lateral connection line 110 via the bonding layer 108 of the at least one stand-off structure 104. This enables an electrical interconnection between electrodes of devices and pads, especially when the electrodes and pads are separated by a deep trench and/or a deep trench with a cavity, or when electrodes of devices have a deep trench inside packaging and pads outside packaging. The structure is created automatically during fabricating a bonding structure. Thus, there is no need for additional lithography or etching processes which would make the manufacturing process more complex and expensive.

The bonding layer 108 comprises a eutectic alloy. The eutectic alloy can comprise two or more metals. Suitable eutectic alloys include, for example, germanium-aluminum, gold-tin, gold-germanium, gold-silicon, gold-indium or copper-tin alloy.

According to an embodiment, each of the at least one insulating stand-off structure 104 has a height less than 10 μm, such as less than 5 μm, for example 1-2 μm.

According to an embodiment, the thickness of the first lateral electrical connection line 109 is 0.2-5 μm, such as 0.5-1 μm.

According to an embodiment, the thickness of the first lateral electrical connection line 109 is less than the height of the at least one insulating stand-off structure 104.

According to an embodiment, the thickness of the bonding layer 108 is less than 5 μm, such as 0.5-2 μm.

According to an embodiment, the first substrate 102 comprises a passivation layer 111 on the surface of the first substrate 102 and/or the second substrate 103 comprises a passivation layer 112 on the surface of the second substrate 103. The passivation layers can comprise silicon dioxide ($SiO_2$), aluminum oxide ($Al_2O_3$) or aluminum nitride (AlN), for instance. The passivation layers prevent short-circuiting the elements of the package or the packaged device by preventing electrical contact between the elements the substrates.

In an embodiment, the first substrate 102 and the second substrate 103 comprise silicon or ceramic. Silicon is very reliable substrate material as it suffers very little fatigue and can have long service lifetimes without breaking. In single crystal form, silicon has virtually no hysteresis and hence almost no energy dissipation. Suitable ceramic substrates are, for example, silicon nitride, aluminium nitride, titanium nitride or silicon carbide. Aluminum nitride in the wurtzite structure shows pyroelectric and piezoelectric properties, which enables to produce sensors for example, with sensitivity to normal and shear forces. Titanium nitride exhibits a high electrical conductivity and large elastic modulus.

According to an embodiment, the first lateral electrical connection line 109 and the second electrical connection line 110 comprise metal, such as molybdenum, aluminum or copper. These metals enable good and reliable electrical connection in the lateral electrical connection line between the device inside the package and the electrical circuit outside the package.

According to an embodiment, the insulating stand-off structure 104 comprises dielectric material, such as ceramic material. The stand-off structure can comprise for example, silicon dioxide ($SiO_2$), aluminum nitride (AlN), aluminium oxide ($Al_2O_3$), silicon nitride ($Si_3N_4$) or silicon carbide (SiC). These substances provide a good wetting surface for the bonding layer 108 and a good electric insulation.

In an embodiment, the package 100, 200 comprises at least one trench 113, 205, 213 in the first substrate 102, 202. Then, electrical connection is formed between the first lateral electrical connection line 109, 209 and the second lateral connection line 110, 210 via the bonding layer 108 of the at least one stand-off structure 104, 214, 215, 216, 217 and over at least one trench 113, 205, 213 via the second lateral connection line. This enables a simple and cost effective structure to provide electrical interconnection for devices separated by trenches.

According to an embodiment, the wafer level package 200 comprises a cavity 224 in the second substrate 203.

According to an embodiment, the package 200 comprises a getter 225 on a surface of the cavity 224. The getter 225 can be used to create and maintain vacuum. The getter can be a thin film getter. The getter absorbs some or all of the gases anticipated to outgas into the cavity, such as water vapour, oxygen, carbon monoxide, carbon dioxide, nitrogen, hydrogen and/or other gases. The getter comprises metals that easily absorb gas. For example, the getter can comprise at least one of the following: titanium, aluminum, zirconium, boron, cobalt, calcium, strontium or thorium.

In an embodiment, the wafer level package 200 comprises at least one sealing structure 219. The sealing structure 219 can comprise a seal ring 221 between the first substrate 202 and the second substrate 203, a bonding layer 222 on a surface of the second substrate and plurality of micro-rings 223 within the seal ring to confine metal melt of the bonding layer between micro-rings.

More information about seal rings and other associated structures is provided in Patent Application in Finland No. 20205075, which is incorporated herein by reference.

The micro-rings of sealing structure 219 increase process window in the bonding of the substrates, especially in eutectic bonding of the substrates. The micro-rings also provide a precise gap due to a precise height of the micro-rings, which gap is free from temperature and pressure non-uniformities, such as voids. The sealing structure reduces slip misalignment between the bonding substrates due to local indentation and increased friction, hence improving bonding quality.

The seal ring 221 can comprise dielectric material or ceramic material, for example, silicon dioxide ($SiO_2$), aluminum nitride (AlN), aluminium oxide ($Al_2O_3$), silicon nitride ($Si_3N_4$) or silicon carbide (SiC).

The bonding layer 222 can comprise a eutectic alloy. The eutectic alloy can comprise two or more metals. Suitable eutectic alloys include, for example, germanium-aluminum, gold-tin, gold-germanium, gold-silicon, gold-indium or copper-tin alloy.

The structure of wafer package for a device will now be discussed in more detail by means of example embodiments.

Figure 2A:
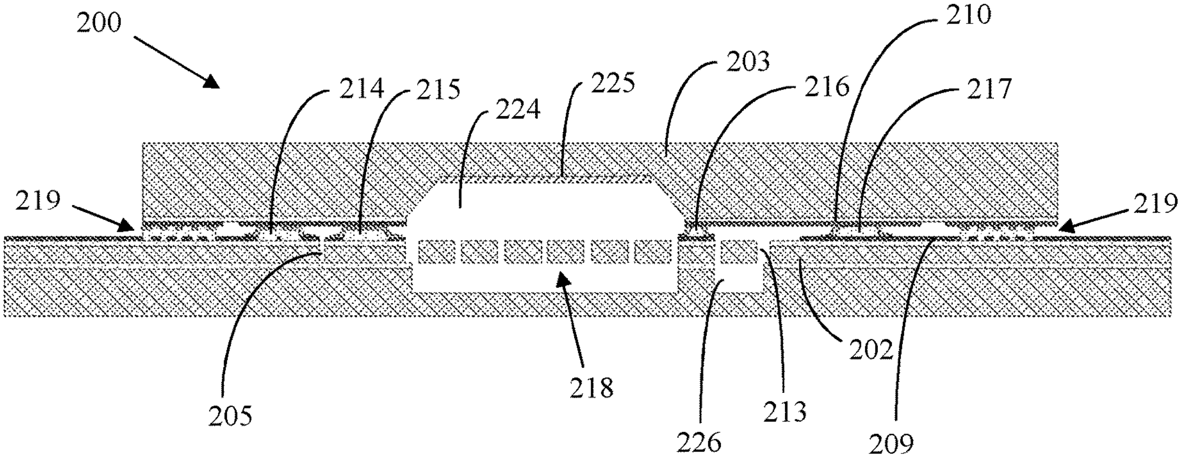
Figure 2B:
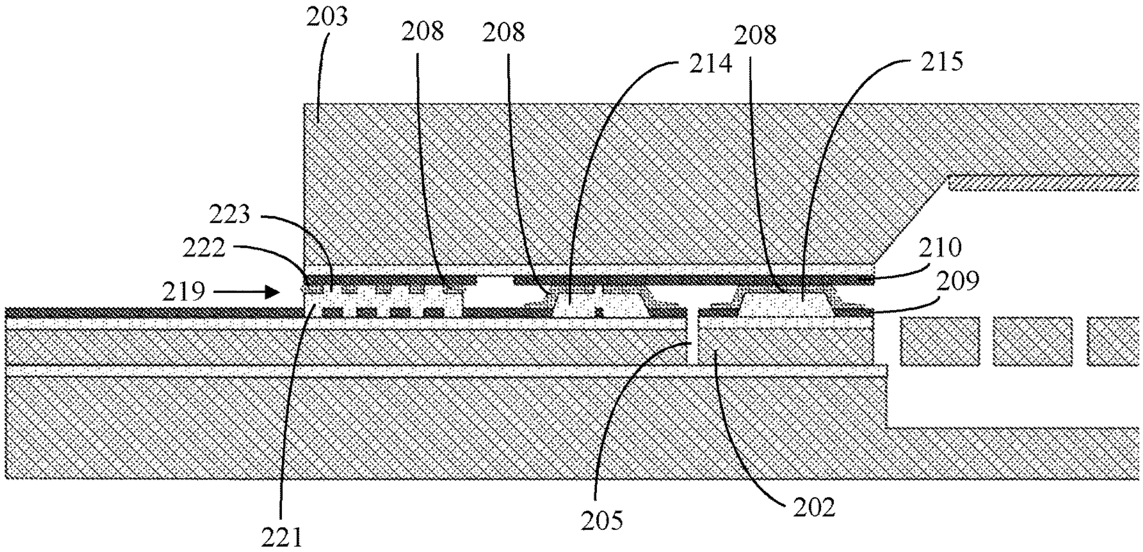
Figure 2C:
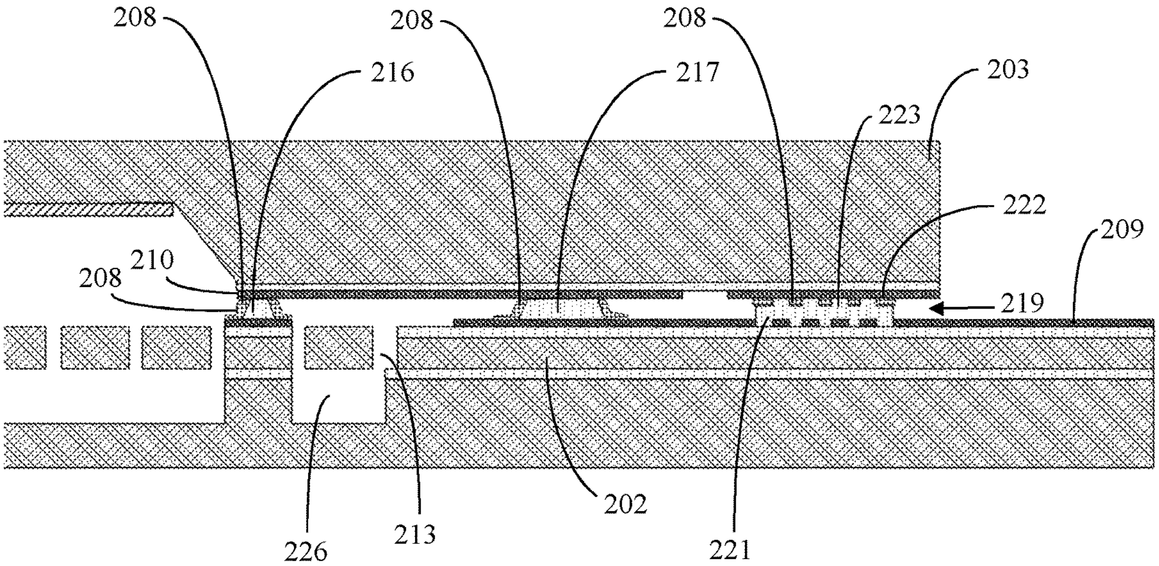

FIGS. 2A to 2C illustrate that the package 200 comprises four stand-off structures 214, 215, 216, 217 between the first substrate 202 and the second substrate 203. The package comprises a bonding layer 208 on the stand-off structures 214, 215, 216, 217. A first lateral electrical connection line 209 is on a surface of the first substrate 202 and a second lateral electrical connection line 210 is on a surface the second substrate 203.

FIGS. 2A to 2C illustrate that the package 200 comprises at least one trench 205, 213 in the first substrate 202. The package can comprise a trench 205 between insulating stand-off structures 214, 215 and a trench 213 between insulating stand-off structures 216, 217. Then, electrical connection is formed between the first lateral electrical connection line 209 and the second lateral connection line 210 via the bonding layers 208 of the stand-off structures 214, 215 and the second lateral electrical connection line 210 over the trench 205 and via the bonding layers 208 of the stand-off structures 216, 217 together with the second lateral electrical connection line 210 over the trench 213.

FIGS. 2A to 2C illustrate that the package 200 comprises a trench 213 with a cavity 226.

FIG. 2B illustrates that electric signal can pass from the first electrical lateral connection line 209 to the second lateral electrical connection line 210 through the bonding layer 208 of the stand-off structure 215 and through the second lateral electrical connection line 210 over the trench 205 between the stand-off structures 214, 215. Respectively, electric signal can pass from the second lateral electrical connection line 210 to the first lateral electrical connection line 209 through the bonding layer 208 of the stand-off structure 214.

FIG. 2C illustrates that electric signal can pass from the first lateral electrical connection line to the second lateral electrical connection line through the bonding layer of the stand-off structure 216 and through the second lateral electrical connection line 210 over the trench 213 between the stand-off structures 216, 217. Respectively, electric signal can pass from the second lateral electrical connection line 210 to the first lateral electrical connection line 209 through the bonding layer 208 of the stand-off structure 217.

Furthermore, FIG. 2A illustrates that the wafer level package 200 comprises a cavity 224 in the second substrate 203. In addition, the package 200 comprises a getter 225 on a surface of the cavity 224.

FIGS. 2A to 2C illustrate that the wafer level package 200 comprise a sealing structure 219. The sealing structure 219 may surround the cavity 224.

According to an embodiment, there is provided a method for forming a wafer level package 100, 200 for a device, the method comprising: making a first lateral electrical connection line 109, 209 on a surface of a first substrate 102, 202, making a second lateral electrical connection line 110, 210 on a surface of a second substrate 103, 203, making at least one insulating stand-off structure 104, 214, 215, 216, 217 over a portion of the first lateral electrical connection line 109, 209, making a first bonding material layer 106, 206 on the surface of the at least one stand-off structure 104, 214, 215, 216, 217, and bonding the first bonding material layer 106, 206 with the second lateral electrical connection line 110, 210 to create a bonding layer 108, 208 on the stand-off structure 104, 214, 215, 216, 217 to create an electrical connection between the first lateral electrical connection line 109, 209 and the second lateral connection line 110, 210 via the bonding layer 108, 208 of the at least one stand-off structure 104, 214, 215, 216, 217. This enables a simple and cost effective way to provide electrical interconnection for devices.

Bonding the first bonding material layer 106, 206 with the second lateral electrical connection line 110, 210 is provided by eutectic bonding. First, temperature can be raised to a value lower than the eutectic temperature of the eutectic alloy. Then, temperature can be maintained constant for short time to reach uniform heating of both first substrate and second substrate. After that, temperature can be increased to a temperature exceeding the eutectic point. Finally, the structure can cool down to a temperature below the eutectic temperature.

Eutectic bonding does not require use of high contact force during the bonding. Eutectic bonding is less sensitive to surface flatness irregularities, scratches, as well as to particles compared to the direct wafer bonding methods, because the eutectic bonding process goes through a liquid phase.

According to an embodiment, the second lateral electrical connection line 110, 210 comprises a second bonding material layer 107, 207 on a surface of the second lateral electrical connection line 110, 210. Thus, the first bonding material layer 106, 206 can be bond with the second bonding material layer 107, 207 to create bonding layer 108, 208.

According to an embodiment, the method comprises making a passivation layer 111, 211 on the surface of the first substrate 102, 202 and/or making a passivation layer 112, 212 on the surface of the second substrate 103, 203. The passivation layer 111, 112 can be grown by thermal oxidation in which a layer is exposed to oxygen and/or steam to grow a thin surface layer on the layer.

According to an embodiment, the method comprises making at least one trench 113, 205, 213 in the first substrate 102, 202. The method can comprise making a trench 205 between insulating stand-off structures 214, 215 and a trench 213 between insulating stand-off structures 216, 217. The trench can be formed by for example, silicon wet or dry etching.

The method can comprise forming of a cavity 224 in the second substrate 203. The cavity can be formed by for example, silicon wet or dry etching.

Furthermore, the method can comprise forming a getter 225 on the cavity 224 in the second substrate 203. The getter 225 can be formed by getter deposition process. The getter can be deposited for example, by using sputtering, resistive evaporation, e-beam evaporation or other suitable deposition technique.

In an embodiment, the method comprises making at least one sealing structure 219 over a portion of the first lateral electrical connection line 209. First, a seal ring 221 of the sealing structure 219 is formed over a portion of the first lateral electrical connection line 209. Then, a first bonding material layer 206 is formed on a surface of the seal ring 221. After that, a second bonding material layer 207 is formed on a surface of a second substrate 203. Finally, the first bonding material layer is bond with the second bonding material layer to create bonding layer 208.

Layers of at least one sealing structure 219 can be formed simultaneously with layers of at least one insulating stand-off structure 104, 214-217. For example, the seal ring 221 of the sealing structure 219 can be formed while the insulating stand-off structure 104, 214-217 is formed. Accordingly, the first bonding material layers 206 and the second bonding material layers 207 of the sealing structure and insulating stand-off structure can be formed simultaneously.

The method for forming the wafer package for a device will now be discussed in more detail by means of example embodiments.

Figure 3A:
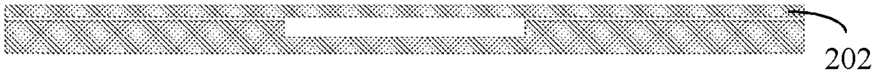
FIGS. 3A to 3F illustrate a manufacturing method of a first structure of a wafer level package for a device in accordance with at least some embodiments of the present invention.
Figure 3B:
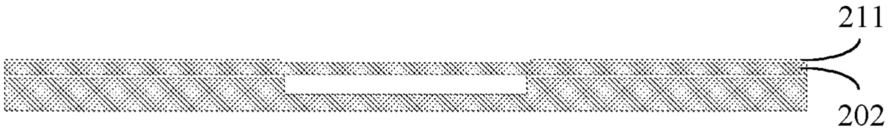
Figure 3C:
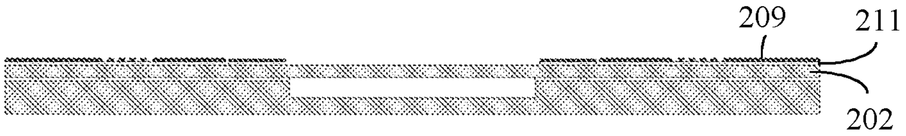
Figure 3D:
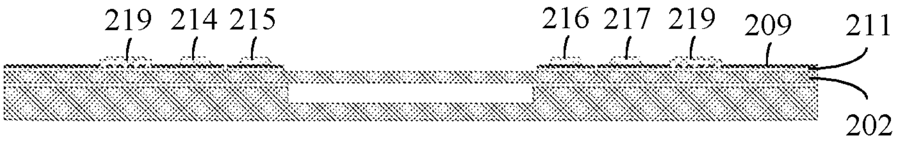
Figure 3E:
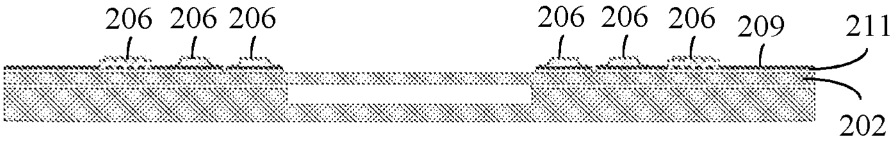
Figure 3F:
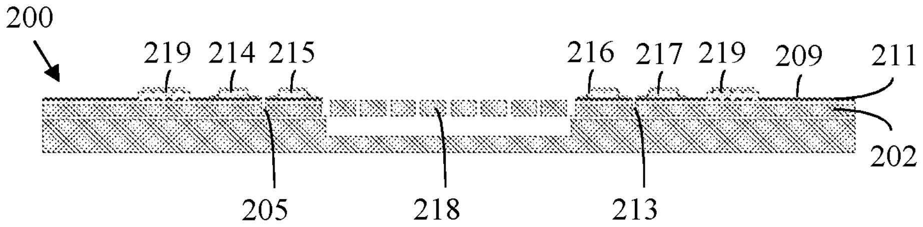

FIGS. 3A to 3F illustrate a manufacturing method of a first structure according to some embodiments. First, a first substrate 202 for preparing a MEMS structure is obtained. The structure comprises two layers of silicon bonded together and enclosing a cavity inside, as is illustrated in FIG. 3A. Then, a passivation layer 211 is provided on the first substrate 202 (FIG. 3B). A first lateral electrical connection line 209 is deposited on the passivation layer 211 (FIG. 3C). After that, at least one insulating stand-off structure 214, 215, 216, 217 is deposited on the first lateral electrical connection line 209. Moreover, also at least one sealing structure 219 can be deposited on the first lateral electrical connection line 209 (FIG. 3D). Then, a first bonding material layer 206 is deposited on a surface of the at least one stand-off structure 214, 215, 216, 217 and/or at least one sealing structure 219 as illustrated in FIG. 3E. Finally, trenches 205, 213 and a MEMS device 218 are formed in the first substrate 202, for example, by silicon wet or dry etching.

FIGS. 4A to 4E illustrate a manufacturing method of a second structure according to some embodiments. First, a passivation layer 212 is provided on a second substrate 203 (FIG. 4A). Then, a second lateral electrical connection line 210 and a second bonding material layer 207 is deposited on the passivation layer 212 (FIG. 4B). As illustrated in FIG. 4C, the passivation layer 212 can be removed partially, for example, by plasma cleaning, wet chemical etching or dry chemical etching. After that, a cavity 224 can be formed in the second substrate 203, for example, by silicon wet or dry etching (FIG. 4D). Finally and optionally, a getter 225 can be deposited on a surface of the cavity 224 as illustrated in FIG. 4E.

A deposition of layers of the wafer level package 100, 200, such as a first bonding material layer 106, 206 and a second bonding material layer 107, 207, can be conducted by a deposition process. The deposition process can comprise for example, physical vapor deposition (PVD) or chemical vapor deposition (CVD).

FIG. 5 illustrates an alternative embodiment for forming a wafer level package. A first substrate 302 comprises a passivation layer 311 on a surface of the first substrate. In addition, the first substrate 302 comprises a sealing structure 319 and a first lateral connection line 309 on a surface of the first substrate. The sealing structure 319 comprises a seal ring 321 and a first bonding material layer 306 on a surface of the seal ring. A second substrate 303 comprises a stand-off structure 304. The stand-off structure 304 comprises a second bonding material layer 307 on a surface of the stand-off structure. A trench 313 is formed in the first substrate between the sealing structure and the stand-off structure 304.

The wafer level package is formed by bonding the first bonding material layer 306 on the sealing ring 321 with the second bonding material layer 307 to form a bonding layer. Then, electrical connection is formed over the at least one trench 313 via the second bonding material layer 307.

Figure 6:
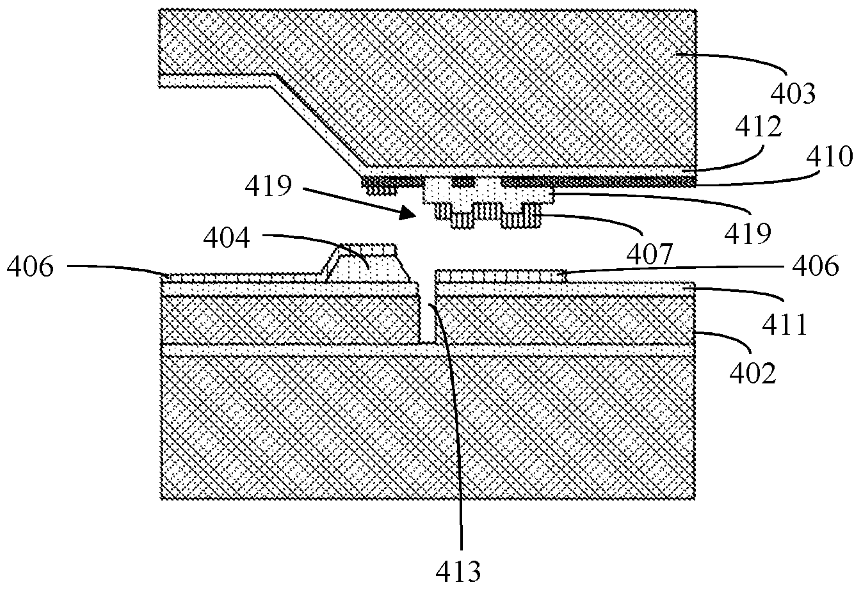

FIG. 6 illustrates an alternative embodiment for a wafer level package. A first substrate 402 comprises a stand-off structure 404. A first bonding material layer 406 is partially on a surface of the stand-off structure 404 and the first substrate 402. A second substrate 403 comprises a second lateral electrical connection line 410 and a sealing structure 419. The sealing structure 419 comprises a seal ring 421. A second bonding material layer 407 is on a surface of the seal ring and partially on a surface of the second lateral electrical connection line 410. The first substrate can further comprise a passivation layer 411 on a surface of the first substrate and the second substrate can further comprise a passivation layer 412 on a surface of the second substrate. A trench 413 is in the first substrate between the stand-off structure 404 and the sealing structure 419.

The wafer level package is formed by bonding the first bonding material layer 406 with the second bonding material layer 407. Then, electrical connection is formed over the trench via the second lateral electrical connection line 410.

According to some embodiments, the sealing structure is for a MEMS device. However, the sealing structure can be used in other devices, such as automotive devices, e.g. lidar components and tire pressure sensors, RF components, e.g. switches, filters, inductors and antennas, passive photonic devices, e.g. silicon wave guide and modulator, microspectrometer components and plasmonic devices.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the following description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The verbs "to comprise" and "to include" are used in this document as open limitations that neither exclude nor require the existence of also un-recited features. The features recited in depending claims are mutually freely combinable unless otherwise explicitly stated. Furthermore, it is to be understood that the use of "a" or "an", i.e. a singular form, throughout this document does not exclude a plurality.

REFERENCE SIGNS LIST

100, 200 wafer level package
102, 202, 302, 402 first substrate

103, 203, 303, 403 second substrate
104, 304, 404 stand-off structure
106, 206, 306, 406 first bonding material layer
107, 207, 307, 407 second bonding material layer
108, 208 bonding layer
109, 209, 309 first lateral electrical connection line
110, 210, 410 second lateral electrical connection line
111, 112, 211, 212, 311, 411, 412 passivation layer
113, 205, 213, 313, 413 trench
214-217 stand-off structure
218 MEMS device
219, 319, 419 sealing structure
221, 321, 421 seal ring
222 bonding layer
223 micro-ring
224, 226 cavity
225 getter

The invention claimed is:

1. A wafer level package for a device, the package comprising:

a first substrate and a second substrate, at least one insulating stand-off structure between the first substrate and the second substrate, a bonding layer on the at least one insulating stand-off structure, and a first lateral electrical connection line on a surface of the first substrate and a second lateral electrical connection line on a surface of the second substrate, wherein electrical connection is formed between the first lateral electrical connection line and the second lateral electrical connection line via the bonding layer of the at least one insulating stand-off structure, and wherein the bonding layer comprises a eutectic alloy.

2. The wafer level package of claim 1, wherein each of the at least one insulating stand-off structure has a height less than 10 μm.

3. The wafer level package of claim 1, wherein the thickness of the first lateral electrical connection line is 0.2-5 μm.

4. The wafer level package of claim 1, wherein the thickness of the first lateral electrical connection line is less than the height of the at least one insulating stand-off structure.

5. The wafer level package of claim 1, wherein the thickness of the bonding layer is less than 5 μm.

6. The wafer level package of claim 1, wherein the first substrate comprises a passivation layer on the surface of the first substrate and the second substrate comprises a passivation layer on the surface of the second substrate.

7. The wafer level package of claim 1, wherein the package comprises at least one trench in the first substrate.

8. The wafer level package of claim 7, wherein electrical connection is formed over the at least one trench via the second lateral electrical connection line.

9. The wafer level package of claim 7, wherein electrical connection is formed over the at least one trench via a second bonding material layer.

10. The wafer level package of claim 1, wherein the package comprises at least one sealing structure, which sealing structure comprises:

a seal ring between the first substrate 202) and the second substrate, a bonding layer on a surface of the second substrate, and plurality of micro-rings within the seal ring to confine metal melt of the bonding layer between micro-rings.

11. The wafer level package of claim 1, wherein the package contains a MEMS device.

12. The wafer level package of claim 1, wherein each of the at least one insulating stand-off structure has a height less than 5 μm.

13. The wafer level package of claim 1, wherein each of the at least one insulating stand-off structure has a height between 1-2 μm;

the thickness of the first lateral electrical connection line is 0.5-1 μm; and the thickness of the bonding layer is 0.5-2 μm.

14. The wafer level package of claim 1, wherein the first substrate is a MEMS device wafer and the second substrate is a cap wafer.

15. A wafer level package for a MEMS device, the package comprising:

a MEMS device wafer;

a first lateral electrical connection line on a surface of the MEMS device wafer;

a cap wafer;

a second lateral electrical connection line on a surface of the cap wafer;

at least one insulating stand-off structure between the MEMS device wafer and the cap wafer; and a bonding layer on the at least one insulating stand-off structure;

wherein the first lateral electrical connection line is electrically connected to the second lateral electrical connection line via the bonding layer of the at least one insulating stand-off structure.

16. The wafer level package of claim 15, wherein the package comprises at least one trench in the MEMS device wafer.

17. The wafer level package of claim 16, wherein the second lateral electrical connection line forms an electrical connection over the at least one trench.

18. The wafer level package of claim 15, wherein the package comprises a seal ring between the MEMS device wafer and the cap wafer.

19. The wafer level package of claim 15, wherein the bonding layer comprises a eutectic alloy.

20. A wafer level package for a device, the package comprising:

a first substrate;

a first lateral electrical connection line on a surface of the first substrate;

a second substrate;

a second lateral electrical connection line on a surface of the second substrate;

at least one insulating stand-off structure between the first substrate and the second substrate;

a bonding layer on the at least one insulating stand-off structure, the bonding layer comprising a eutectic alloy, and the bonding layer electrically connecting the first lateral electrical connection line to the second lateral electrical connection line.

* * * * *